US008233640B2

(12) United States Patent
Takahashi

(10) Patent No.: US 8,233,640 B2
(45) Date of Patent: Jul. 31, 2012

(54) SOUND OUTPUT DEVICE

(75) Inventor: Ryuuji Takahashi, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 1156 days.

(21) Appl. No.: 12/078,528

(22) Filed: Apr. 1, 2008

(65) Prior Publication Data

US 2008/0240451 A1 Oct. 2, 2008

(30) Foreign Application Priority Data

Apr. 2, 2007 (JP) ................................ 2007-096028

(51) Int. Cl.
*H03G 3/00* (2006.01)

(52) U.S. Cl. ........ 381/109; 381/104; 381/105; 381/120; 348/738

(58) Field of Classification Search .................... 381/56, 381/57, 109, 104, 105, 120; 348/738
See application file for complete search history.

(56) References Cited

FOREIGN PATENT DOCUMENTS

| | | |
|---|---|---|
| JP | 63-299493 | 12/1988 |
| JP | 02-218227 | 8/1990 |
| JP | 06-197395 | 7/1994 |
| JP | 09-130698 | 5/1997 |
| JP | 2005-142962 | 6/2005 |
| JP | 2006060354 A * | 3/2006 |

* cited by examiner

*Primary Examiner* — Kimberly Nguyen
*Assistant Examiner* — Errol Fernandes
(74) *Attorney, Agent, or Firm* — Morgan, Lewis & Bockius LLP

(57) ABSTRACT

A sound output device of the present invention for outputting sound according to audio data fed thereto includes: a volume adjuster that is operated by a user in a predetermined manner, and that determines a ratio of volume of the sound to predetermined reference volume according to how it is operated by the user; a time detector detecting that a predetermined time has come; and a reference volume adjuster adjusting the reference volume according to a detection result of the time detector. Thus, the maximum level of the volume (which is dependent on the reference volume) can be automatically adjusted according to the current time. The volume adjuster determines the ratio of volume to reference volume according to the operation by the user. Thus, for example, the same operation performed by the user even under different levels of reference volume produces almost the same ratio of volume to reference volume. As a result, ease with which the user adjusts the volume can be prevented as much as possible from being impaired.

11 Claims, 5 Drawing Sheets

SOUND OUTPUT DEVICE

This application is based on Japanese Patent Application No. 2007-096028 filed on Apr. 2, 2007, the contents of which are hereby incorporated by reference.

BACKGROUND OF THE INVENTION

1. Field of the Invention

The present invention relates to a sound output device outputting sound according to audio data fed thereto, and in particular relates to one that is capable of adjusting volume.

2. Description of Related Art

Broadcast receiving apparatuses such as television broadcast receiving apparatuses are conventionally provided with a sound output device outputting sound via a speaker or the like according to audio data (e.g., data of sound in a broadcast program) fed thereto. Such a sound output device is typically provided with a volume control function for the user to freely control the volume as he/she wishes. Examples of documents relevant to this technical field include JP-A-H06-197395, JP-A-2005-142962, JP-A-H02-218227, JP-A-S63-299493, and JP-A-H09-130698.

With the above-mentioned sound output device whose volume can be freely controlled by the user as he/she wishes, even late at night (in late-night hours), for example, when sound output at high volume bothers people around, sound may be outputted at high volume. No problem should arise if the user voluntarily keeps the volume low in late-night hours, but the user may fail to notice that it is already late at night, or may go away leaving the device on.

In addition, it is essential for a sound output device to be designed such that the user can control the volume with ease. For example, in a sound output device designed such that the volume is controlled by selecting one from multiple volume steps (on the part of the user, by performing a certain operation to select a volume step), it needs to be: easy for the user to see which step he/she should select to obtain certain volume; otherwise, the sound output device cannot be user-friendly.

SUMMARY OF THE INVENTION

The present invention has been made in terms of the above problems, and an object of the present invention is to provide a sound output device that can be controlled to automatically adjust the maximum level of volume according to the current time and that can prevent the ease with which the user adjusts the volume from being impaired even when such an adjustment is performed.

To achieve the above object, according to one aspect of the present invention, a sound output device outputting sound according to audio data fed thereto includes: a volume adjuster that is operated by a user in a predetermined manner and that determines a ratio of volume of the sound to predetermined reference volume according to how it is operated by the user; a time detector detecting that a predetermined time has come; and a reference volume adjuster adjusting the reference volume according to a detection result of the time detector.

With this configuration, since the reference volume adjuster is provided, the maximum level of volume (which depends on the reference volume) can be automatically adjusted according to the current time. Furthermore, the volume adjuster determines the ratio of volume to reference volume according to the operation by the user. Thus, the same operation performed by the user even under different levels of reference volume produces almost the same ratio of volume to reference volume. As a result, the ease with which the user controls the volume can be prevented as much as possible from being impaired.

According to the present invention, in the configuration described above, the reference volume adjuster may perform a first adjustment operation in which the reference volume adjuster adjusts the reference volume to be a predetermined level when a first predetermined time is found to have come.

With this configuration, for example, by setting the first predetermined time to a time at which late-night hours start and by setting the predetermined volume low enough not to bother people around, sound output at high volume can be prevented as much as possible from taking place in the late-night hours, when it bothers people around.

According to the present invention, in the configuration described above, the reference volume adjuster may perform, when a second predetermined time is found to have come, a second adjustment operation in which the reference volume adjuster adjusts the reference volume to be a level at which the reference volume is before the first adjustment operation is performed.

With this configuration, by setting the second predetermined time to a time at which the late-night hours end, the reference volume can be automatically returned to its original level when ordinary hours (i.e., non-late-night hours) start again. This makes it possible to achieve an easier operation of turning the volume down only in late-night hours and returning it to normal in ordinary hours.

According to another aspect of the present invention, a broadcast receiving apparatus includes: a receiving device receiving a broadcast wave to obtain audio data of contents of the broadcast wave; and a sound output device configured as described above to output sound according to the audio data. With this broadcast receiving apparatus, the volume can be automatically turned down when, for example, the user watches a late-night program.

According to another aspect of the present invention, a broadcast receiving apparatus includes: a receiving device receiving a broadcast wave to obtain audio data of contents of the broadcast wave; and a sound output device outputting sound according to the audio data. Here, the sound output device includes: a volume adjuster that is operated by a user in a predetermined manner and that determines a ratio of volume of the sound to predetermined reference volume according to how it is operated by the user; a time detector detecting that a predetermined time has come; and a reference volume adjuster adjusting the reference volume according to a detection result of the time detector, and the reference volume adjuster performs, when a first predetermined time is found to have come, a first adjustment operation in which the reference volume adjuster adjusts the reference volume to be a predetermined level or lower, and the reference volume adjuster performs, when a second predetermined time is found to have come, a second adjustment operation in which the reference volume adjuster adjusts the reference volume to be a level at which the reference volume is before the first control operation is performed. With this broadcast receiving apparatus, it is possible to exploit the advantages of the above described configurations.

BRIEF DESCRIPTION OF THE DRAWINGS

The above-described and other objects and features of the present invention will become more apparent from the following detailed description of preferred embodiments thereof and with reference to the accompanied drawings showing the following.

DETAILED DESCRIPTION OF PREFERRED EMBODIMENTS

Figure 1:
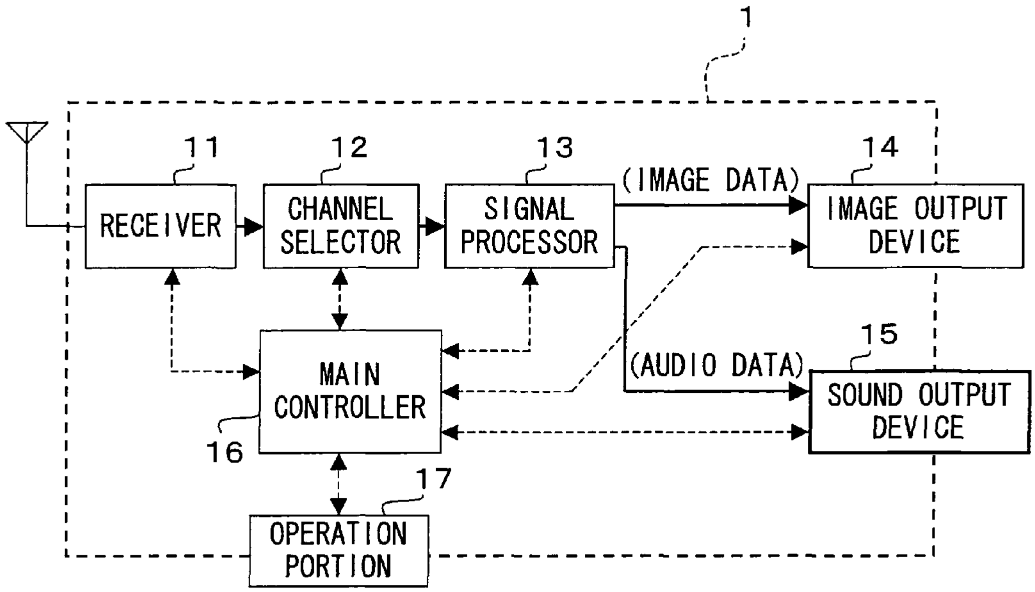
FIG. 1 is a block diagram showing a television broadcast receiving apparatus embodying the present invention.

Now, a description will be given of an embodiment of the present invention dealing with a television broadcast receiving apparatus configured as shown in FIG. 1. As shown in the figure, the television broadcast receiving apparatus 1 includes: a receiver 11, a channel selector 12, a signal processor 13, an image output device 14, a sound output device 15, main controller 16, and an operation portion 17.

The receiver 11 is provided with, for example, an antenna, and receives a broadcast wave of television broadcast to obtain a broadcast signal to transmit the received broadcast signal to a following circuit.

The channel selector 12 is provided with, for example, a tuning circuit, and extracts a broadcast signal of a channel (i.e., selects a channel) specified by the main controller 16 out of the broadcast signal transmitted from the receiver 11, and transmits the extracted broadcast signal to a following circuit.

The signal processor 13 obtains, according to the broadcast signal of the selected channel, data of an image of a broadcast program (image data) and data of sound of the broadcast program (audio data), and feeds them separately to respective relevant one of following circuits.

The image output device 14 is provided with, for example, a display device, and displays the image of the broadcast program according to the image data transmitted from the signal processor 13. Incidentally, the brightness and the contrast in the image display can be adjusted according to an instruction from the main controller 16.

The sound output device 15 is provided with, for example, a speaker device, and outputs the sound of the broadcast program according to the audio data transmitted from the signal processor 13. The sound output device 15 can adjust the volume of the outputted sound according to an instruction from the main controller 16. A more specific description will be later given of the configuration of the sound output device 15.

The main controller 16 performs overall control of each process carried out in the television broadcast receiving apparatus 1. The operation portion 17 is built as a user interface provided with, for example, a remote control signal receiving device and a button switch. When the user operates the operation portion 17 in a predetermined manner, data corresponding to how the user has operated it is fed to the main controller 16, and this permits the user's intention to be reflected in various processes.

Incidentally, the operations the user is allowed to perform include at least a volume adjustment operation for adjusting the volume of the sound output device 15. This volume adjustment operation may be performed in various manners such as by freely selecting one from volume steps provided in 63 stages from the minimum to the maximum or by turning a dial switch (in such a manner that the volume increases as the dial is turned clockwise).

With the configuration described above, the television broadcast receiving apparatus 1 receives a broadcast wave of television broadcast and outputs the image and sound of a television program. Thus, the user can enjoy a television program as he/she desires.

Figure 2:
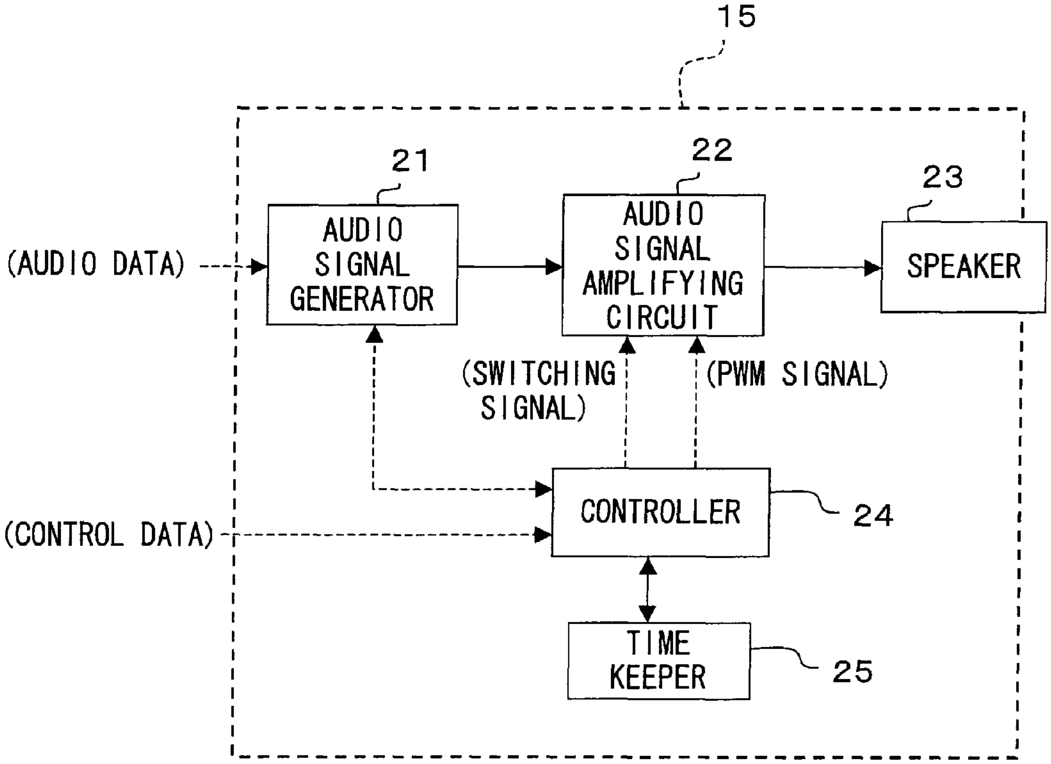
FIG. 2 is a block diagram showing a sound output device embodying the present invention.

Next, a more specific description will be given of the configuration of the sound output device 15 with reference to FIG. 2. As shown in the figure, the sound output device 15 is provided with, for example, an audio signal generator 21, an audio signal amplifying circuit 22, a speaker 23, a controller 24, and a time keeper 25.

The audio signal generator 21 generates, according to audio data transmitted from the signal processor 13, a signal (audio signal) so formed as to be capable of making the speaker 23 output sound. Incidentally, the volume of the sound outputted from the speaker 23 increases with the amplitude of the audio signal.

The audio signal amplifying circuit 22 amplifies the amplitude of the audio signal generated by the audio signal generator 21. This makes it possible to vary the volume of the sound outputted from the speaker 23. The amplification ratio in the amplification process is determined according to a switching signal and a PWM signal transmitted from the controller 24. A more specific description will be given later of the configuration of the audio signal amplifying circuit 22.

The controller 24 controls each process performed in the sound output device 15 according to, for example, data fed thereto from the main controller 16 and the time keeper 25. The time keeper 25 is provided with, for example, a crystal oscillator, and feeds the controller 24 with a signal having a predetermined cycle, based on which signal the controller 24 recognizes the current time.

Figure 3:
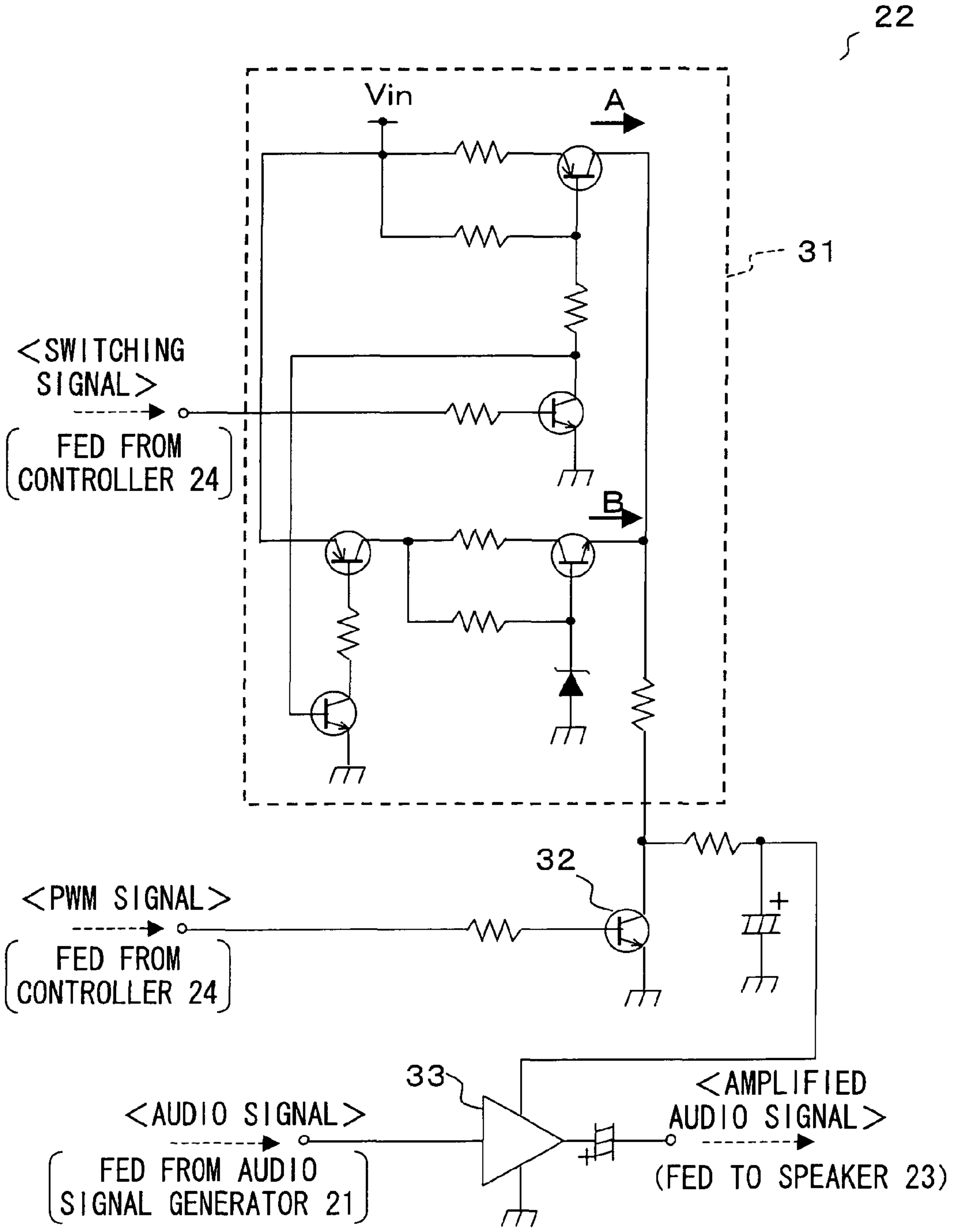
FIG. 3 is a circuit diagram specifically showing the configuration of an audio signal amplifying circuit.

Here, a specific description will be given of the configuration of the audio signal amplifying circuit 22 with reference to FIG. 3. As shown in the figure, the audio signal amplifying circuit 22 is provided with, for example, a voltage switching circuit 31, a transistor 32, and an amplifier 33.

The voltage switching circuit 31 receives a switching signal (which is H level or L level at a time) from the controller 24 to generate a voltage corresponding to a state of the switching signal to feed the generated voltage to a power supply terminal of the amplifier 33. That is, in FIG. 3, the voltage switching circuit 31 passes a supply voltage Vin through one of routes A and B that corresponds to the state of the switching signal, and generates a voltage to be outputted via the one of the routes A and B. For example, when the switching signal is H level, the voltage switching circuit 31 outputs a voltage of 5 V via the route A, and when the switching signal is L level, it outputs a voltage of 3.3 V via the route B.

The transistor 32 receives at its base a PWM (pulse width modulation) signal from the controller 24, and its emitter is grounded. To the collector of the transistor 32 is connected the midpoint between the output side of the voltage switching circuit 31 and the power supply terminal of the amplifier 33. Thus, a voltage supplied to the power supply terminal of the amplifier 33 is adjusted according to the duty ratio of the PWM signal.

The amplifier 33 amplifies an audio signal fed thereto from the audio signal generator 21, and feeds the amplified audio signal to the speaker 23. The amplification ratio here is determined according to the voltage fed to the power supply terminal of the amplifier 33. Therefore, the amplification ratio is determined according to the states of the switching signal and the PWM signal.

With this configuration, the audio signal amplifying circuit 22 can not only switch the reference volume (and thus the maximum volume) between two levels according to the switching signal but also change the ratio of volume to reference volume according to the duty ratio of the PWM signal.

More specifically, when the switching signal is L level, the reference volume is comparatively low; in contrast, when the switching signal is H level, the reference volume is comparatively high. Also, the lower the duty ratio of the PWM signal is, the lower the volume is; in other words, the higher the duty ratio of the PWM signal is, the higher the volume is. Incidentally, the reference voltage when the switching signal is L level is set to be low enough not to bother people around even when sound is outputted in late-night hours.

As described above, the adjustment of the amplification ratio in amplifying the audio signal according to the switching signal and the PWM signal is achieved not by a software process but solely by a hardware process. Thus, the adjustment is free from trouble caused by a freeze that may occur in a software process.

Figure 4:
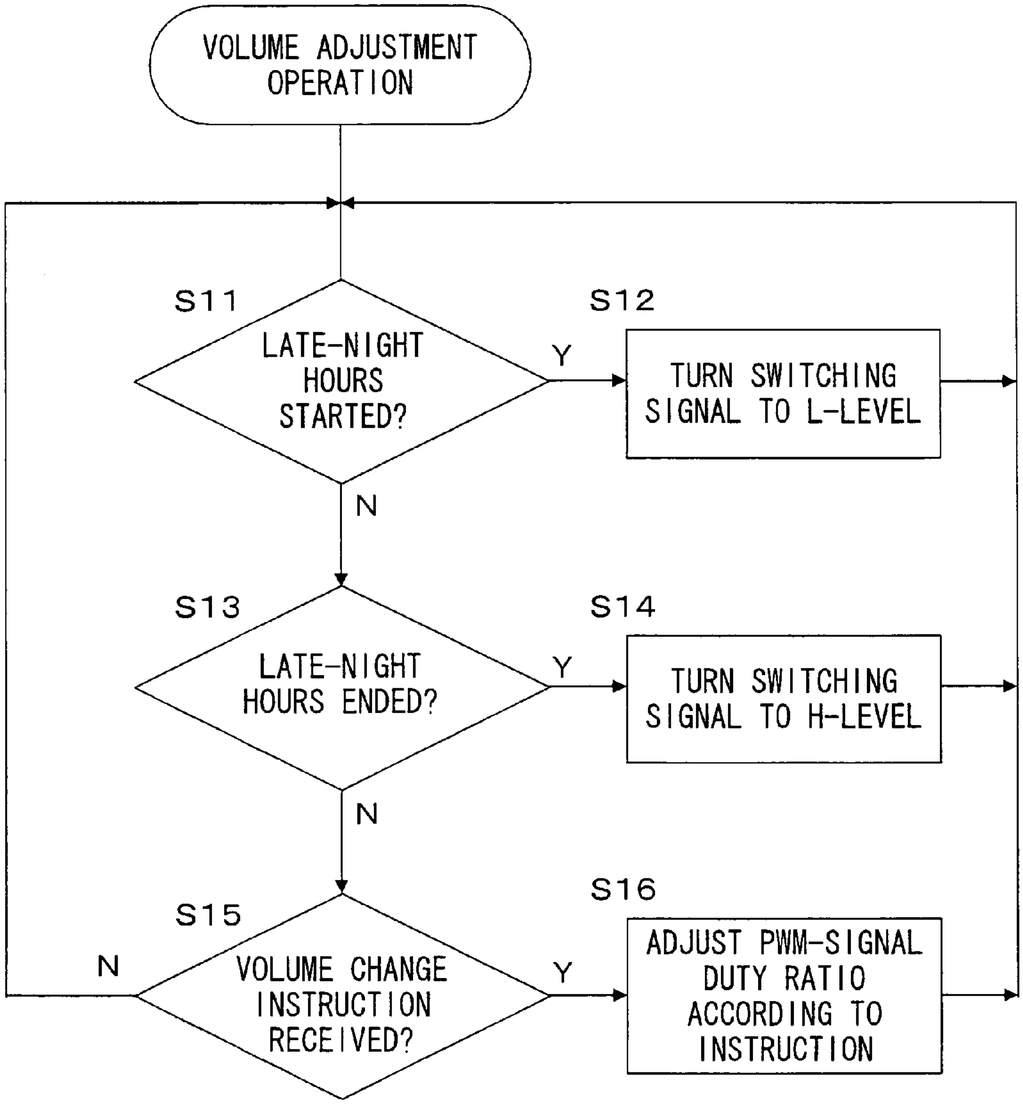
FIG. 4 is a flow chart showing how a volume adjustment operation is performed.

Next, a description will be given of how volume is adjusted in the sound output device 15 with reference to FIG. 4 presented as a flow chart. The controller 24 monitors, based on data fed thereto from the time keeper 25, whether or not late-night hours have started (i.e., whether or not the transition from ordinary hours to late-night hours has taken place) and whether or not late-night hours have ended (i.e., whether or not the transition from late-night hours to ordinary hours has taken place) (steps S11 and S13). Incidentally, late-night hours are set by the user in advance to be, for example, “from 11 o’clock at night to 6 o’clock in the morning”.

When the late-night hours are found to have started (Y at step S11), the level of the switching signal is turned to L level (step S12), and when the late-night hours are found to have ended (Y at step S13), the level of the switching signal is turned to H level (step S14).

The controller 24 also monitors, based on data fed thereto from the main controller 16, whether or not the user is performing a volume adjustment operation at the operation portion 17 (step S15). When the volume adjustment operation is found to have been performed (Y at step S15), the controller 24 adjusts the duty ratio of the PWM signal according to the state of the volume adjustment operation by the user (step S16). More specifically, when the volume adjustment operation is found to have been performed to turn the volume down, the duty ratio is decreased, and when the volume adjustment operation is found to have been performed to turn the volume up, the duty ratio is increased.

Through the series of processes performed as described above, at the sound output device 15, the reference volume (and thus the maximum volume) is automatically adjusted to be low at the beginning of the late-night hours. Thus, sound output at high volume can be prevented as much as possible from taking place in the late-night hours, when it bothers people around.

When the late-night hours end, the reference volume is automatically returned to its original level (i.e., the state thereof before it undergoes the process at step S12). Thus, the user does not need to return the reference volume to its original level by himself/herself, which is convenient to the user.

Figure 5:
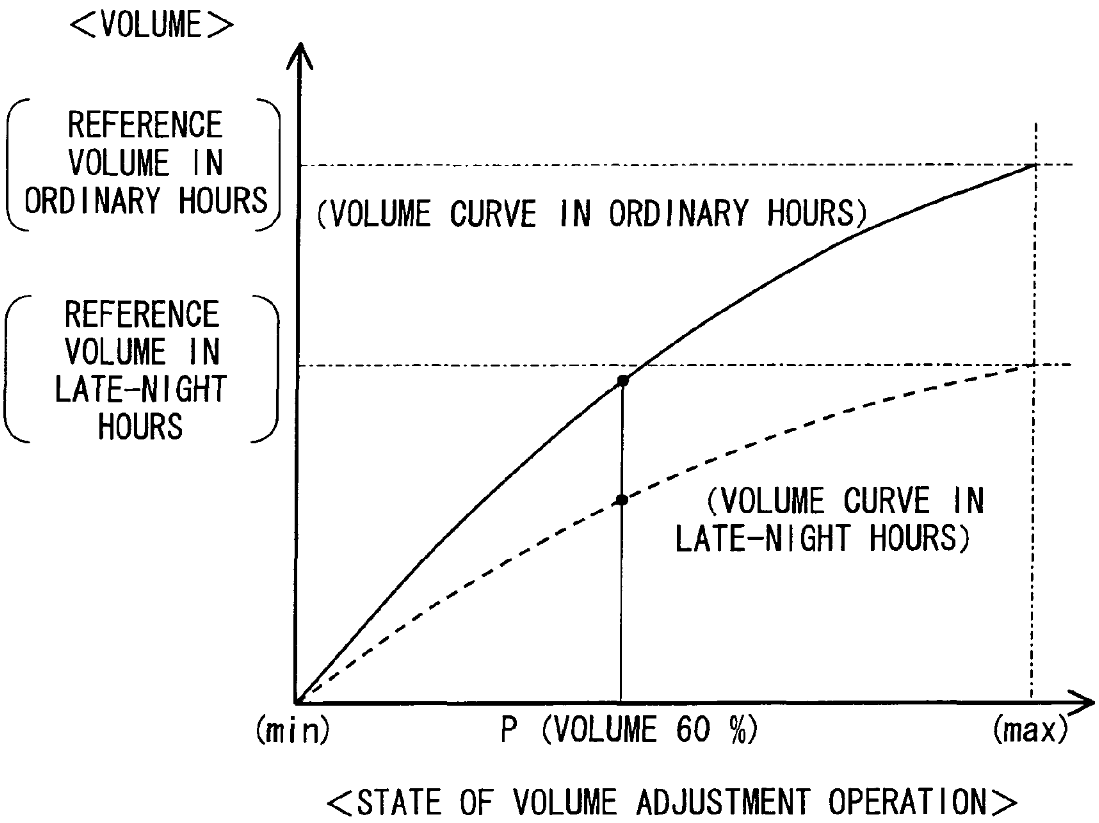
FIG. 5 is a graph showing the relationship between the volume and the state of the volume adjustment operation.

FIG. 5 is a graph showing the relationship between the volume and the state of the volume adjustment operation by the user. In the graph, the horizontal axis represents the state of the volume adjustment operation by the user, indicating a volume adjustment operation for higher volume toward the right side along the horizontal axis, and the vertical axis represents the volume. In FIG. 5, two different curves (showing the relationship between the volume and the volume adjustment operation) are illustrated, one showing the relationship in the normal hours, the other showing the relationship in the late-night hours; whether in the ordinary hours or in the late-night hours, volume adjustment operations performed by the user in the same manner produce almost the same ratio of actual volume to reference volume.

That is, the correspondence between the state of the volume adjustment operation by the user and the duty ratio of the PWM signal is constant regardless of the state of the switching signal (and thus, the output state of the voltage switching circuit 31). Thus, when the user performs a volume adjustment operation indicated by point P in FIG. 5 (“volume 60%”), whether in the ordinary hours or in the late-night hours, sound is outputted at volume 60% as high as the reference volume.

Since the ratio of volume to reference volume corresponds to the volume adjustment operation by the user in the above-described manner, though the sound output device 15 is designed such that the reference volume changes according to which hours the current time belongs to, the ease with which the user controls the volume is prevented as much as possible from being impaired.

The level of the switching signal may be changed at a timing when the user has performed a predetermined operation, as well as at steps S12 and S14 described above. This enables the user, for example, to voluntarily lower the reference volume to achieve a finer control of the volume in a low volume range.

Whether or not the current time belongs to the late-night hours may be judged when the power supply to the television broadcast receiving apparatus 1 is turned on (i.e., when the television broadcast receiving apparatus 1 shifts from a standby state to an operating state); if the current time is found to belong to the late-night hours, the switching signal is turned to L level. This helps prevent an unexpected output of sound at high volume occurring when the power supply to the television broadcast receiving apparatus 1 is turned on.

The present invention may be carried out in any manner other than specifically described above as an embodiment, and many modifications and variations are possible within the scope and spirit of the present invention.

It should be noted that the sound output device of the present invention is a sound output device outputting sound according to audio data fed thereto, including: a volume adjuster that is operated by the user in a predetermined manner and that determines a ratio of volume of the sound to predetermined reference volume according to how it is operated by the user; a time detector detecting that a predetermined time has come; and a reference volume adjuster adjusting the reference volume according to a detection result of the time detector.

The provision of the reference volume adjuster described above enables the sound output device to automatically adjust the maximum level of volume (which is dependent on the reference volume) according to the current time. The volume adjuster determines the ratio of volume to reference volume according to an operation by the user. Thus, the same operation performed by the user even under different levels of reference volume produces almost the same ratio of volume to reference volume. As a result, the ease with which the user adjusts the volume can be prevented as much as possible from being impaired.

What is claimed is:

1. A sound output device outputting sound according to an audio signal fed thereto, comprising:

an audio signal amplifying circuit that amplifies the audio signal with an amplification ratio according to a volume adjustment signal and a switching signal;

a volume adjuster that is operated by a user in a predetermined manner and that determines a ratio of volume of the sound to predetermined reference volume by outputting the volume adjustment signal according to how the volume adjuster is operated by the user;

a time detector detecting that a predetermined time has come; and a reference volume adjuster adjusting the reference volume by outputting the switching signal according to a detection result of the time detector, wherein the audio signal amplifying circuit includes:

an amplifier that includes a power supply terminal and that amplifies the audio signal with an amplification ratio according to a voltage fed to the power supply terminal; and a voltage switching circuit that outputs a voltage corresponding to a state of the switching signal; and the audio signal amplifying circuit adjusts the voltage outputted from the voltage switching circuit according to the volume adjustment signal, and feeds the adjusted voltage to the power supply terminal.

2. The sound output device of claim 1, wherein the reference volume adjuster, when a first predetermined time is found to have come, changes a state of the switching signal and performs a first adjustment operation in which the reference volume adjuster adjusts the reference volume to be a predetermined level.

3. The sound output device of claim 2, wherein the reference volume adjuster, when a second predetermined time is found to have come, changes the state of the switching signal and performs a second adjustment operation in which the reference volume adjuster controls the reference volume to be a level at which the reference volume is before the first adjustment operation is performed.

4. A broadcast receiving apparatus, comprising:

a receiving device receiving a broadcast wave to obtain an audio signal of contents of the broadcast wave; and the sound output device of any one of claims 1 to 3 that outputs sound according to the audio signal.

5. The sound output device of claim 1, wherein the volume adjuster outputs a PWM signal as the volume adjustment signal; and the audio signal amplifying circuit includes a first transistor which receives the PWM signal via a base thereof, and the audio signal amplifying circuit uses the first transistor to adjust the voltage outputted from the voltage switching circuit.

6. The sound output device of claim 5, wherein the voltage switching circuit includes a second transistor to which the switching signal is fed, and the voltage switching circuit uses the second transistor to output the voltage corresponding to the state of the switching signal by passing a supply voltage through one of routes that corresponds to the state of the switching signal.

7. The sound output device of claim 1, wherein the voltage switching circuit includes a second transistor to which the switching signal is fed, and the voltage switching circuit uses the second transistor to output the voltage corresponding to the state of the switching signal by passing a supply voltage through one of routes that corresponds to the state of the switching signal.

8. A broadcast receiving apparatus, comprising:

a receiving device receiving a broadcast wave to obtain an audio signal of contents of the broadcast wave; and a sound output device outputting sound according to the audio signal, wherein the sound output device includes:

an audio signal amplifying circuit that amplifies the audio signal with an amplification ratio according to a volume adjustment signal and a switching signal;

a volume adjuster that is operated by a user in a predetermined manner and that determines a ratio of volume of the sound to predetermined reference volume by outputting the volume adjustment signal according to how the volume adjuster is operated by the user;

a time detector detecting that a predetermined time has come; and a reference volume adjuster adjusting the reference volume by outputting the switching signal according to a detection result of the time detector;

the audio signal amplifying circuit includes:

an amplifier that includes a power supply terminal and that amplifies the audio signal with an amplification ratio according to a voltage fed to the power supply terminal; and a voltage switching circuit that outputs a voltage corresponding to a state of the switching signal, and the audio signal amplifying circuit adjusts the voltage outputted from the voltage switching circuit according to the volume adjustment signal, and feeds the adjusted voltage to the power supply terminal; and the reference volume adjuster, when a first predetermined time is found to have come, changes a state of the switching signal and performs a first adjustment operation in which the reference volume adjuster adjusts the reference volume to be a predetermined level or lower, and the reference volume adjuster, when a second predetermined time is found to have come, changes the state of the switching signal and performs a second adjustment operation in which the reference volume adjuster adjusts the reference volume to be a level at which the reference volume is before the first control operation is performed.

9. The broadcast receiving apparatus of claim 8, wherein the volume adjuster outputs a PWM signal as the volume adjustment signal; and the audio signal amplifying circuit includes a first transistor which receives the PWM signal via a base thereof, and the audio signal amplifying circuit uses the first transistor to adjust the voltage outputted from the voltage switching circuit.

10. The broadcast receiving apparatus of claim 9, wherein the voltage switching circuit includes a second transistor to which the switching signal is fed, and the voltage switching circuit uses the second transistor to output the voltage corresponding to the state of the switching signal by passing a supply voltage through one of routes that corresponds to the state of the switching signal.

11. The broadcast receiving apparatus of claim 8, wherein the voltage switching circuit includes a second transistor to which the switching signal is fed, and the voltage switching circuit uses the second transistor to output the voltage corresponding to the state of the switching signal by passing a supply voltage through one of routes that corresponds to the state of the switching signal.

* * * * *